US008553422B2

(12) United States Patent
Zhao et al.

(10) Patent No.: US 8,553,422 B2

(45) Date of Patent: Oct. 8, 2013

(54) PUSH BUTTON AND ELECTRONIC DEVICE HAVING SAME

(75) Inventors: Kenneth Zhao, Tu-Cheng (TW); Chi-Hsien Fong, Tu-Cheng (TW); Pu Zhao, Shenzhen (CN); Ze-Bing Qiu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 155 days.

(21) Appl. No.: 13/172,859

(22) Filed: Jun. 30, 2011

(65) Prior Publication Data

US 2012/0229994 A1 Sep. 13, 2012

(30) Foreign Application Priority Data

Mar. 10, 2011 (CN) .......................... 2011 1 0057314

(51) Int. Cl.

*H01H 13/14* (2006.01)
*H05K 5/00* (2006.01)

(52) U.S. Cl.

USPC ............................ 361/752; 200/292; 200/341

(58) Field of Classification Search

USPC ............. 200/341, 292; 361/752, 748; 337/34, 337/37, 66

See application file for complete search history.

(56) References Cited

U.S. PATENT DOCUMENTS

| | | | | |
|---|---|---|---|---|
| 5,043,545 | A * | 8/1991 | Yamashita et al. | 200/293 |
| 5,140,293 | A * | 8/1992 | Fournier et al. | 337/37 |
| 6,448,880 | B2 * | 9/2002 | Yu | 337/66 |
| 6,570,111 | B2 * | 5/2003 | Nakagawa et al. | 200/343 |
| 7,173,205 | B2 * | 2/2007 | Yamamoto | 200/343 |
| 7,248,140 | B2 * | 7/2007 | Yu | 337/94 |
| 7,583,174 | B2 * | 9/2009 | Yu | 337/59 |
| 2001/0006145 | A1 | 7/2001 | Yu | |
| 2011/0043452 | A1 | 2/2011 | Zhang | |

FOREIGN PATENT DOCUMENTS

CN 1305204 A 7/2001

* cited by examiner

*Primary Examiner* — Hoa C Nguyen
*Assistant Examiner* — Dimary Lopez
(74) *Attorney, Agent, or Firm* — Altis & Wispro Law Group, Inc.

(57) ABSTRACT

A push button for mounting on an electronic device is disclosed. The electronic device includes a shell defining a hole, and a circuit board received in the shell. The push button includes a pressing member, a switch and a lever. The depressing member is received in the hole. The switch is received in the shell and connected to the circuit board. The switch is configured to be misaligned with the hole. The lever includes a spring arm and an body pivotally connected to the shell. When pressed, the depressing member pushes the lever to rotate from the first position to a second position where the other end of the body of the lever actuates the switch. The disclosure also provides the means of incorporating the push button into a device.

8 Claims, 4 Drawing Sheets

PUSH BUTTON AND ELECTRONIC DEVICE HAVING SAME

BACKGROUND

1. Technical Field

The present disclosure relates to a button, especially to a push button and an electronic device having such push button.

2. Description of Related Art

Typically, a push button includes a captive depressing member and a switch. The depressing member is received in a hole defined in a shell of the electronic device. The switch opposes the hole and can be actuated by the depressing member. When there are a number of buttons, the shell needs to define corresponding holes for receiving the push buttons. As the line of the holes becomes longer, or the area for the holes increases in size, the circuit board on which the switches are mounted on must be correspondingly lengthened or increased in size.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
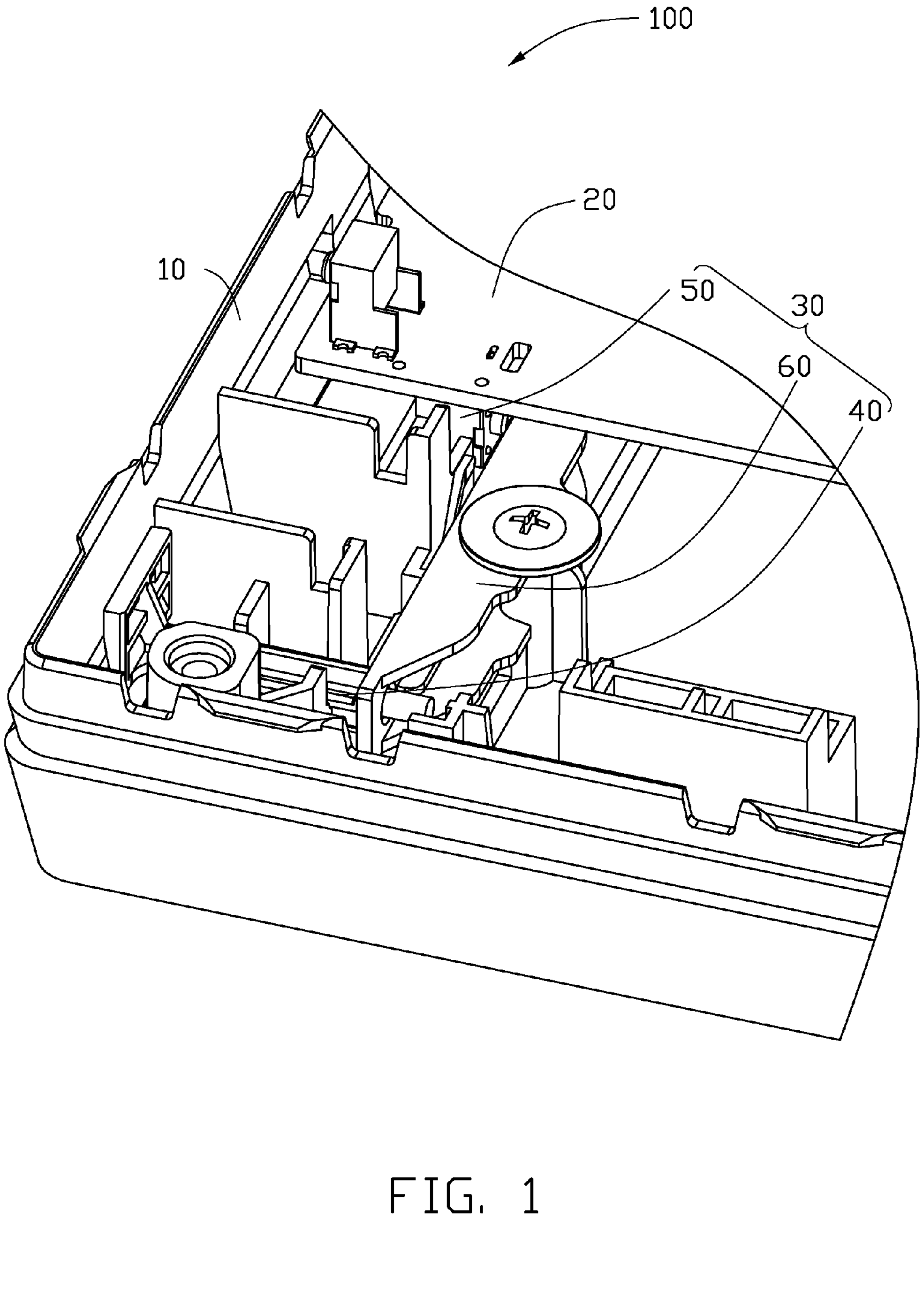
FIG. 1 is a partial, isometric view of an electronic device according to an exemplary embodiment.
Figure 2:
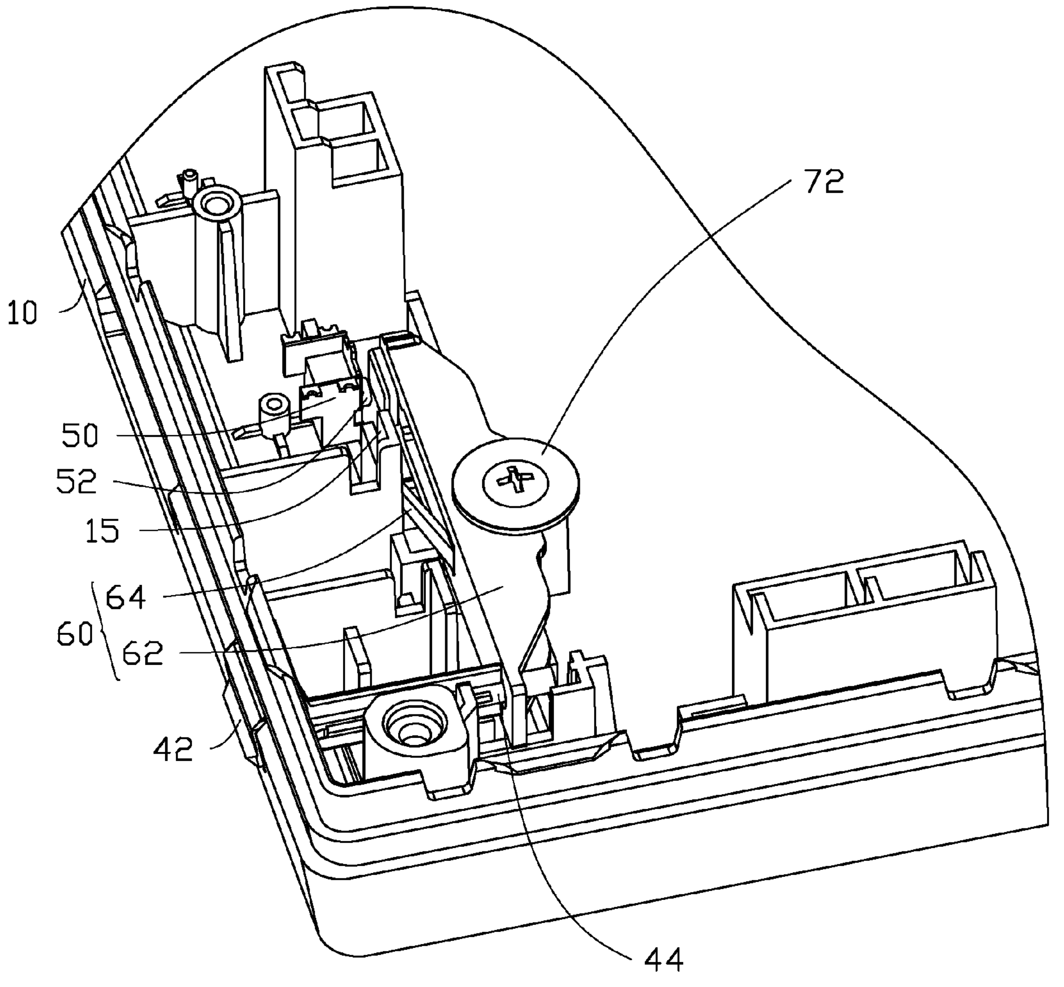
FIG. 2 is similar to FIG. 1, but with the circuit board omitted for clarity.

Referring to FIGS. 1 and 2, an electronic device 100 according to an exemplary embodiment includes a shell 10, a circuit board 20 fixed to the shell 10 and a push button 30 attached to the shell 10. The circuit board 20 is located and fixed firmly into the shell 10.

The push button 30 includes a depressing member 40, a switch 50 and an elastic lever 60. The depressing member 40 is slidably received in a hole 12 defined in the shell 10. The switch 50 is physically and electrically connected to the circuit board 20 and is misaligned with the hole 12. A pushing button 52 of the switch 50 faces the elastic lever 60. The lever 60 is rotationally connected to the shell 10. The lever 60 is positioned between the switch 50 and the depressing member 40. In the exemplary embodiment, the lever 60 can be made of elastic plastic. One end of the lever 60 elastically abuts against the depressing member 40. A gap is formed between the other end of the lever 60 and the pushing button 52. When the push button 30 is pressed, a teetertotter action causes the lever 60 to actuate the pushing button 52 and thereby actuate the switch 50.

Figure 3:
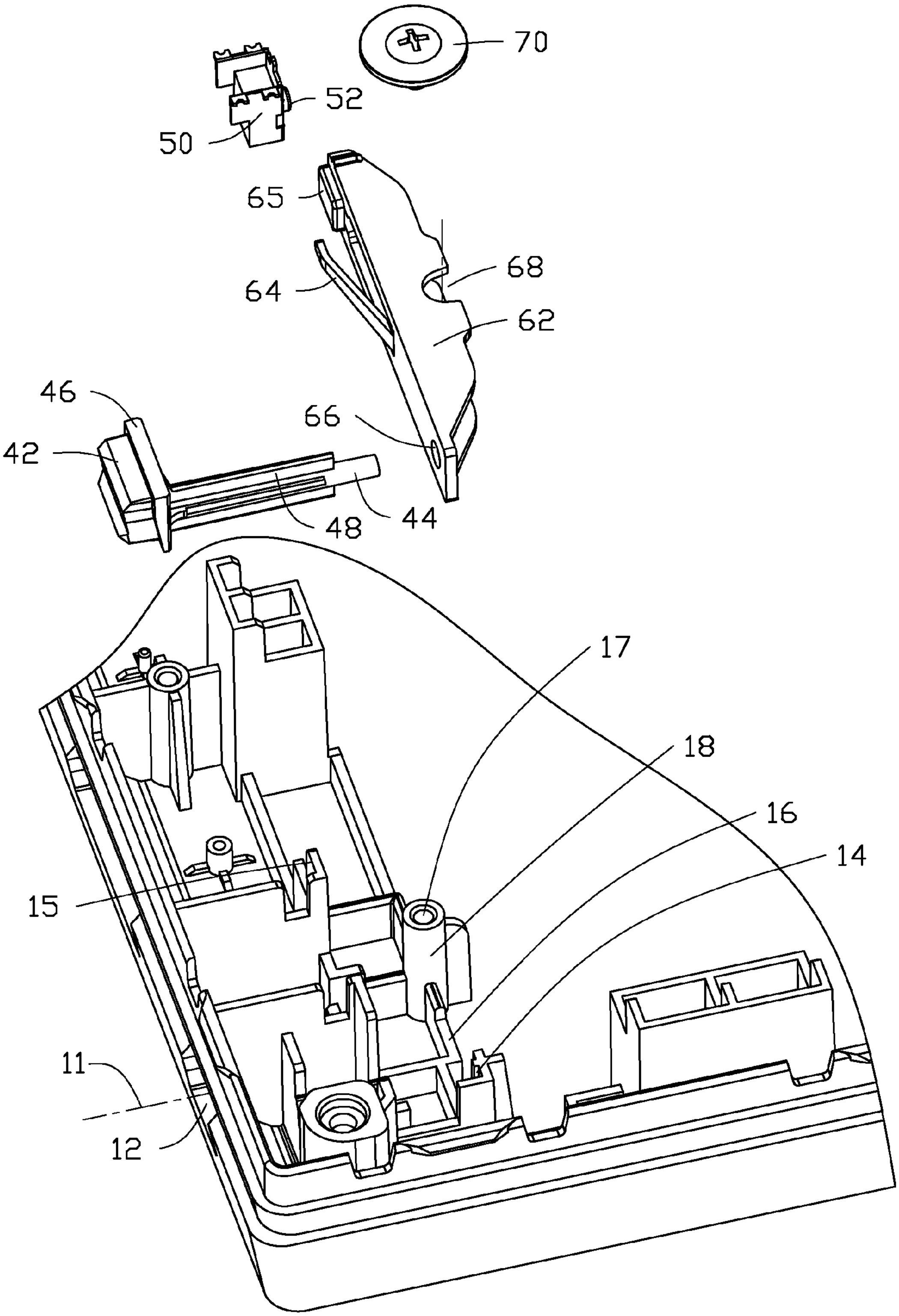
FIG. 3 is an exploded view of the electronic device in FIG. 2.

Referring to FIGS. 2 and 3, the depressing member 40 includes a depressing button portion 42 and a shank 44 depending from the depressing button portion 42. The depressing button portion 42 is loosely received in the hole 12 to provide tactile feedback. The depressing button portion 42 includes an inner peripheral frame (stop projection 46) to keep it captive in the shell 10. The shank 44 includes two radially opposite protruding tabs 48 which extend down the shank for approximately three quarters of its length. The ends of the protruding tabs 48 abut against the lever 60. The shell 10 includes a stop wall 14 facing the hole 12, the wall 14 prevents the continuing inward movement of the depressing member 40.

The lever 60 includes an elongated body 62 and a cantilevered, spring arm 64 extending from one side of the body 62. The arm 64 is inclined relative to the body 62. The body 62 defines a through hole 66 in the side and an cutout 68 in its top. The through hole 66 is aligned with the shank 44 for locating and receiving the end of the shank 44. The cutout 68 is positioned at the middle of the body 62. The axis of the cutout 68 is perpendicular to the motion of the shank 44.

One end of the body 62 positioned over the switch 50 includes a pad (protrusion 65) to make contact with the pushing button 52 to actuate the switch 50. The shell 10 includes a protruding support wall 16, a post 18 and a resisting portion 15, which are all positioned between the depressing member 40 and the switch 50. The lever 60 resides on the protruding support wall 16. The tip end of the shank 44 is engaged in the through hole 66. The top end of the post 18 extends through the cutout 68, allowing the lever 60 to pivot about the post 18. The post 18 defines a threaded hole 17, and a fastener such as a screw or bolt (bolt 70) is secured into the threaded hole 17. The broad head 72 of the bolt 70 covers the post 18 and retains the lever 60 on the post 18 due to the limitation of the head 72. The free end of the spring arm 64 elastically abuts against the resisting portion 15, causing one end of the body 62 to abut against the protruding tabs 48 with minor spring pressure, and the other end of the body 62 to give clearance to the pushing button 52.

Figure 4:
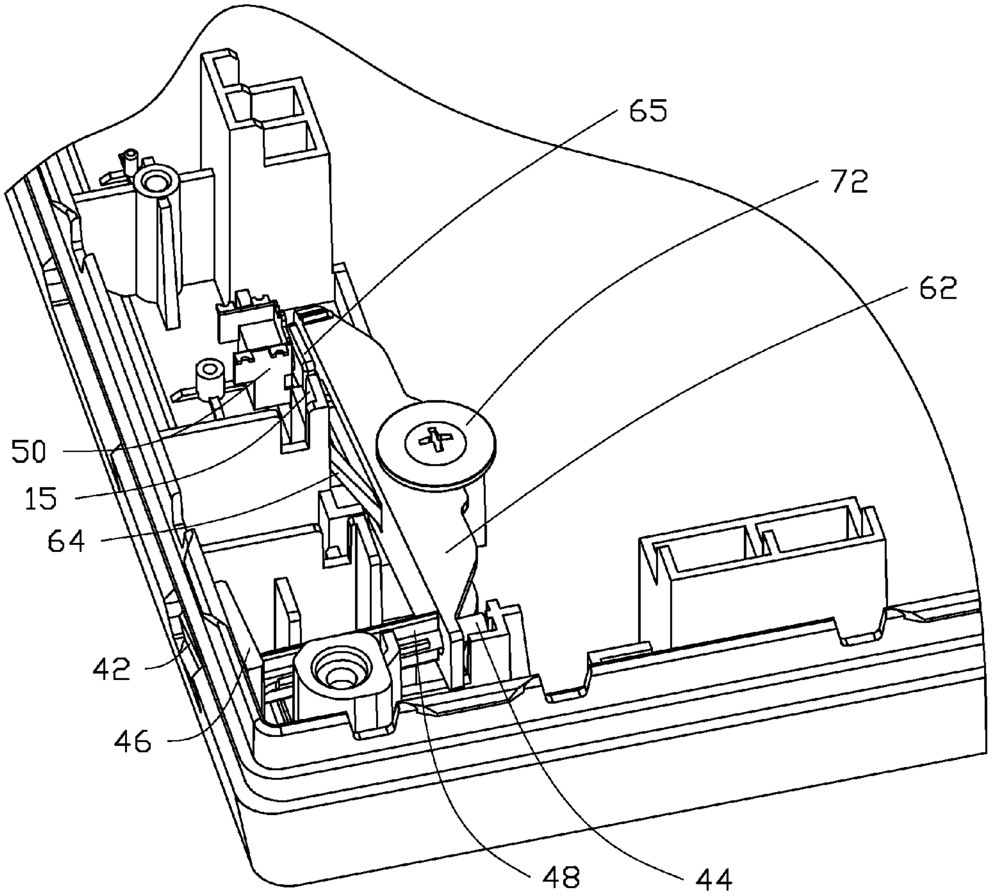
FIG. 4 is similar to FIG. 2, illustrating the push button being depressed.

Referring to FIGS. 2 and 4, when the depressing button portion 42 is depressed, the protruding tabs 48 move inward and push the end of the body 62. The body 62 of the lever 60 thus rotates about the post 18 and the protrusion 65 actually depresses the pushing button 52 to actuate the switch 50. When the depressing button portion is released, spring pressure returns the body 62 and the depressing member 40 to their original positions.

The redirection of the pushing force from the depressing member 40 allows the switch 50 to be located remotely, it is not needed to set the switch 50 in alignment with the depressing member 40. Correspondingly, the options for placing the switch 50 on the circuit board 20 have greatly increased, thereby permitting the more efficient use of circuit board space.

It is to be understood, however, that even though numerous characteristics and advantages of the present disclosure have been set forth in the foregoing description, together with details of the structure and function of the present disclosure, the present disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A push button for mounting on an electronic device, the electronic device comprising a shell defining a hole, and a circuit board received in the shell, the push button comprising:

a depressing member for slidably received in the hole;

a switch for being received in the shell and electrically connecting to the circuit board, the switch configured to be misaligned with the hole, the switch comprising a pushing button; and a lever comprising a spring arm, an elongated body pivotally connected to the shell and positioned between the switch and the depressing member, and the spring arm extending from the body and being inclined relative to the body, a free end of the spring arm being configured for elastically abutting against a portion of the shell to apply a spring force to the body to retain the body in a first position where a first end of the body abuts against the depressing member, and an opposing second end of the body opposes and is spaced from the pushing button;

wherein the depressing member is depressible toward the first end of the body to drive the lever to rotate from the first position to a second position where the second end of the body actuate the pushing button.

2. The push button of claim 1, wherein the shell includes a post, the body defines a cutout for extension of the post therethrough, the body being pivotable about the post.

3. The push button of claim 2, wherein the cutout is located at the middle of the body.

4. The push button of claim 1, wherein the depressing member comprises a depressing button portion and a shank depending from the depressing button portion, the depressing button portion is received in the hole, the body defines a through hole at the first end, the tip end of the shank is engaged in the through hole.

5. An electronic device comprising:

a shell defining a hole;

a circuit board arranged in the shell; and a push button comprising:

a depressing member slidably received in the hole;

a switch electrically connected to the circuit board and misaligned with the hole, the switch comprising a pushing button; and a lever comprising a spring arm and an elongated body pivotally connected to the shell and positioned between the switch and the depressing member, the spring arm obliquely protruding from the body, a free end of the spring arm elastically abutting against a resisting portion of the shell to apply a spring force to the body to retain the body in a first position where a first end of the body abuts against the depressing member, and an opposing second end of the body opposes and is spaced from the pushing button;

wherein the depressing member is depressible toward the first end of the body to drive the lever to rotate from the first position to a second position where the second end of the body actuate the pushing button.

6. The electronic device of claim 5, wherein the shell comprises a protruding support wall and a post both positioned between the switch and the depressing member, the rotation member resides on the protruding support wall, the body defines a cutout, the post extends through the cutout.

7. The electronic device of claim 6, wherein the opening is located at the middle of the body.

8. The electronic device of claim 5, wherein the depressing member comprises a depressing button portion and a shank protruding from the depressing button portion, the depressing button portion is received in the hole, the body defines a through hole, a tip end of the shank is engagingly received in the through hole.

* * * * *